(12) United States Patent
Takahashi et al.

(10) Patent No.: US 8,581,243 B2
(45) Date of Patent: Nov. 12, 2013

(54) THIN-FILM TRANSISTOR AND PROCESS FOR ITS FABRICATION

(75) Inventors: Kenji Takahashi, Yokohama (JP); Ryo Hayashi, Yokohama (JP); Masafumi Sano, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/596,059

(22) PCT Filed: Apr. 16, 2008

(86) PCT No.: PCT/JP2008/057797
§ 371 (c)(1),
(2), (4) Date: Oct. 15, 2009

(87) PCT Pub. No.: WO2008/139859
PCT Pub. Date: Nov. 20, 2008

(65) Prior Publication Data
US 2010/0059751 A1    Mar. 11, 2010

(30) Foreign Application Priority Data

Apr. 27, 2007  (JP) .................. 2007-118736
Jan. 18, 2008  (JP) .................. 2008-009110
Mar. 27, 2008  (JP) .................. 2008-083386

(51) Int. Cl.
*H01L 29/10*  (2006.01)
*H01L 29/12*  (2006.01)
*H01L 29/04*  (2006.01)

(52) U.S. Cl.
USPC ............... 257/43; 257/57; 257/352; 257/353

(58) Field of Classification Search
USPC ..................... 257/43, 57, 352, 353
See application file for complete search history.

(56) References Cited

U.S. PATENT DOCUMENTS

| 6,326,249 B1 | 12/2001 | Yamazaki et al. ............ 438/158 |
| 6,362,511 B1 | 3/2002 | Mizushima et al. .......... 257/412 |
| 7,101,740 B2 | 9/2006 | Young ........................... 438/158 |
| 2003/0037843 A1 | 2/2003 | Hishida ....................... 148/284 |
| 2003/0164290 A1 | 9/2003 | Chen et al. ............... 204/192.29 |
| 2006/0118789 A1* | 6/2006 | Suh et al. ....................... 257/72 |
| 2006/0192197 A1 | 8/2006 | Koganei ........................ 257/40 |
| 2007/0052025 A1 | 3/2007 | Yabuta ......................... 257/347 |

(Continued)

FOREIGN PATENT DOCUMENTS

| JP | 3-171776 A | 7/1991 |
| JP | 06-045605 A | 2/1994 |

(Continued)

OTHER PUBLICATIONS

Office Action dated Dec. 8, 2011, issued in counterpart Taiwanese Application No. 097114354, with translation.

(Continued)

*Primary Examiner* — Ngan Ngo
(74) *Attorney, Agent, or Firm* — Fitzpatrick, Cella, Harper & Scinto

(57) ABSTRACT

A bottom gate type thin-film transistor constituted of at least a substrate, a gate electrode, a gate insulating layer, a semiconductor layer, a source electrode and a drain electrode. At an interface between the gate electrode and the gate insulating layer, the interface has a difference between hill tops and dale bottoms of unevenness in the vertical direction, of 30 nm or less.

4 Claims, 7 Drawing Sheets

(56) References Cited

U.S. PATENT DOCUMENTS

| | | | |
|---|---|---|---|
| 2007/0096079 A1* | 5/2007 | Nakayama et al. | 257/40 |
| 2008/0182356 A1* | 7/2008 | Suh et al. | 438/99 |
| 2009/0072232 A1 | 3/2009 | Hayashi et al. | 257/43 |
| 2009/0186490 A1* | 7/2009 | Nakayama et al. | 438/780 |
| 2009/0218576 A1* | 9/2009 | Dairiki et al. | 257/72 |
| 2010/0276688 A1* | 11/2010 | Yano et al. | 257/43 |
| 2010/0289020 A1* | 11/2010 | Yano et al. | 257/43 |
| 2011/0006297 A1* | 1/2011 | Inoue et al. | 257/43 |
| 2011/0049511 A1* | 3/2011 | Yano et al. | 257/43 |
| 2011/0121290 A1* | 5/2011 | Akimoto et al. | 257/43 |
| 2011/0163311 A1* | 7/2011 | Akimoto et al. | 257/43 |
| 2011/0201162 A1* | 8/2011 | Hosono et al. | 438/163 |
| 2012/0012838 A1* | 1/2012 | Hosono et al. | 257/43 |

FOREIGN PATENT DOCUMENTS

| | | |
|---|---|---|
| JP | 07-134312 | 5/1995 |
| JP | 2001-217203 A | 8/2001 |
| JP | 2002-231959 A | 8/2002 |
| JP | 2004-304009 | 10/2004 |
| JP | 2005-175502 A | 6/2005 |
| JP | 2005-268724 | 9/2005 |
| JP | 2006-216600 | 8/2006 |
| JP | 2007-073311 | 3/2007 |
| WO | WO 2004/038757 A1 | 5/2004 |

OTHER PUBLICATIONS

Office Action dated Nov. 16, 2012, issued in counterpart Taiwanese Application No. 097114354, with translation.

Office Action issued on Jun. 25, 2013, in counterpart Japanese patent application 2008-083386, with translation.

* cited by examiner

THIN-FILM TRANSISTOR AND PROCESS FOR ITS FABRICATION

TECHNICAL FIELD

This invention relates to a thin-film transistor and a process for its fabrication. More particularly, it relates to a bottom gate type thin-film transistor which is transparent to visible light and a process for its fabrication.

BACKGROUND ART

In recent years, at an aim for the application of pixel circuits of liquid-crystal displays and organic electroluminescent displays, development is energetically made on semiconductor elements transparent to visible light which have thin-film transistors making use of transparent oxide semiconductors in active layers.

A thin-film transistor element currently in common use is shown in FIG. 1 as a sectional view. First, a gate metal is formed on an insulating substrate 1, and is then patterned in a desired shape to form a gate electrode 2. On this gate electrode, a gate insulating layer 3, a semiconductor film 4, a source electrode 5 and a drain electrode 6 are formed in this order, thus a thin-film transistor element is completed. In what is shown in FIG. 1, a protective layer 7 is further formed for the purpose of protecting the thin-film transistor element.

In such a thin-film transistor element, there are various points to which attention should be paid in order to achieve good transistor characteristics. For example, Japanese Patent Application Laid-open No. H06-045605 discloses a problem that any unevenness of an interface between the gate insulating layer and the semiconductor layer may cause a lowering of electron mobility. The unevenness of an interface between the gate insulating layer and the semiconductor layer is also considered to cause an increase in interface trap level, an increase in effective channel length, unevenness of layer thickness of the semiconductor layer, stepped-cut of the semiconductor layer, and so forth. That is, how the interface between the gate insulating layer and the semiconductor layer be kept smooth is one of important points in order to keep the electron mobility from lowering, to improve characteristics of thin-film transistors.

In thin-film transistors transparent to visible light, a solid solution of indium oxide and tin oxide (hereinafter termed "ITO") is commonly used as a transparent electrode. ITO thin films are obtained in a polycrystalline or amorphous form depending on conditions for their formation. Compared with polycrystalline ITO thin films, amorphous ITO thin films have a better surface smoothness and have a superior readiness in fine processing by etching. On the other hand, the amorphous ITO thin films have an inferior electric conductivity, and hence the polycrystalline ITO thin films are commonly used for electrodes.

However, if the ITO thin film is formed as a transparent gate electrode under such conditions that it comes to have the polycrystalline form at the time its formation has been completed, a large unevenness reflecting the crystal habit of crystal grains may inevitably come about on the surface of the thin film obtained. Then, where a gate insulating layer laid over the thin film is amorphous, the gate insulating layer is affected by the underlying gate electrode to come into a layer having a greatly uneven surface.

As stated above, if a semiconductor layer is formed on such a gate insulating layer having a large surface unevenness, the interface between the gate insulating layer and the semiconductor layer becomes greatly uneven to inevitably cause deterioration of thin-film transistor characteristics. Thus, in a bottom gate type thin-film transistor in which the gate insulating layer, the semiconductor layer, the source electrode/drain electrode and the protective layer are formed in this order on the gate electrode, there has been a problem that any sufficient characteristics are not obtainable when the polycrystalline ITO thin film is used as the gate electrode.

DISCLOSURE OF THE INVENTION

The present invention has been made taking account of the above problem. Accordingly, it aims to provide a thin-film transistor transparent to visible light, having been made to have the gate electrode surface unevenness as less as possible that is causative of the deterioration of characteristics, and provide a process for its fabrication.

The present invention is a bottom gate type thin-film transistor comprising at least a substrate, a gate electrode, a gate insulating layer, a semiconductor layer, a source electrode and a drain electrode, characterized in that, at an interface between the gate electrode and the gate insulating layer, the interface has a difference between hill tops and dale bottoms of unevenness in the vertical direction, of 30 nm or less. The thin-film transistor is also characterized in that the gate electrode is made of a solid solution of indium oxide and tin oxide or a solid solution of indium oxide and zinc oxide. The thin-film transistor is still also characterized in that the semiconductor layer is an amorphous oxide semiconductor film.

Further, the present invention is a process for fabricating a bottom gate type thin-film transistor, comprising at least a first step of forming a gate electrode on a substrate, a second step of forming a gate insulating layer on the gate electrode, a third step of forming a semiconductor layer on the gate insulating layer and a fourth step of forming a source electrode and a drain electrode on the semiconductor layer; the process being characterized in that, in the first step, the gate electrode formed on the substrate is an amorphous transparent electrode, and the amorphous transparent electrode is crystallized by being subjected to heat treatment later than the second step. The process is also characterized in that the heat treatment is carried out after the fourth step of forming a source electrode and a drain electrode, and all the layers constituting the thin-film transistor stand amorphous until the heat treatment is carried out. The process is still also characterized in that all the layers constituting the thin-film transistor are formed at a temperature of 250° C. or less.

In the present invention, at the interface between the gate electrode and the gate insulating layer, the difference between hill tops and dale bottoms of unevenness in the vertical direction of the interface is controlled within a specific numerical range so that the intended effect can be brought out. Stated specifically, the difference between hill tops and dale bottoms of unevenness in the vertical direction of the interface is so controlled as to be 30 nm or less, preferably 3.0 nm or less, and most preferably 1.0 nm or less. Making the interface have such evenness or smoothness that satisfies the above numerical range can provide a thin-film transistor kept from any deterioration of thin-film transistor characteristics which is otherwise caused by the unevenness of the interface between the gate insulating layer and the semiconductor layer. According to the thin-film transistor fabrication process of the present invention, the unevenness of the interface between the gate electrode and the gate insulating layer can be controlled, and hence the thin-film transistor can be kept from deterioration of its characteristics.

BEST MODE FOR CARRYING OUT THE INVENTION

An embodiment of the present invention is described below in detail with reference to the drawings.

Figure 1:
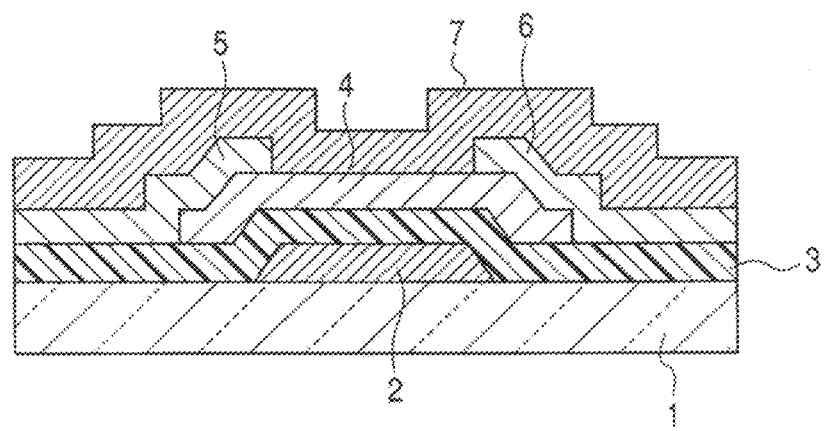
FIG. 1 is a view showing an example of the construction of a bottom gate type thin-film transistor according to an embodiment of the present invention.

FIG. 1 cross-sectionally illustrates a bottom gate type thin-film transistor according to this embodiment. This thin-film transistor is so structured that a gate electrode 2, a gate insulating layer 3, a semiconductor layer 4, a source electrode 5/a drain electrode 6 and a protective layer 7 are formed on a substrate 1 in this order. In this embodiment, all members making up the thin-film transistor are made of materials transparent to visible light. In the present invention, like this, all members making up the thin-film transistor may be made of materials transparent to visible light. This is preferable because the light can effectively be utilized when the transistor is used as a driver of a light-emitting device or the like.

The substrate 1 is an insulating substrate. A glass substrate may be used, for example. As the substrate, an organic material or a polymeric material may also be used, such as polyethylene terephthalate (PET). This enables fabrication of the thin-film transistor by using a flexible substrate.

The gate electrode 2, the source electrode 5 and the drain electrode 6 are transparent electrodes, which make use of transparent conductive oxides such as a solid solution of indium oxide and tin oxide (ITO) and a solid solution of indium oxide and zinc oxide (hereinafter termed "IZO").

In the gate insulating layer 3, it is preferable to use $SiO_2$. Instead, it is also preferable to use in the gate insulating layer a material containing at least one of $SiO_2$, $Y_2O_3$, $Al_2O_3$, $Ta_2O_5$, $ZrO_2$, $HfO_2$ and $TiO_2$.

Then, in this embodiment, the interface between the gate electrode 2 and the gate insulating layer 3 is characterized by having such evenness that the difference between hill tops and dale bottoms of unevenness in the vertical direction of the interface is 30 nm or less, preferably 3.0 nm or less, and most preferably 1.0 nm or less. Controlling the difference between hill tops and dale bottoms of unevenness in this way makes any unevenness of the gate insulating layer 3 less adversely affect the semiconductor layer 4 when the semiconductor layer 4 is superposed on the gate insulating layer 3.

In the present invention, the difference between hill tops and dale bottoms of unevenness in the vertical direction of the interface is meant to be roughness of the interface between the gate electrode 2 and the gate insulating layer 3. It is difficult to actually measure the roughness of the interface, and hence, in the present invention, the roughness of the interface is specified in the following way. That is, to know the roughness of the interface between the gate electrode 2 and the gate insulating layer 3 formed thereon, only the gate insulating layer 3 is formed on the gate electrode 2, in the state of which the surface roughness of the gate insulating layer 3 is measured with an atomic force microscope, and this surface roughness is regarded as the roughness of the interface between the gate electrode 2 and the gate insulating layer 3, and is measured as the value of Rmax found on the atomic force microscope.

The semiconductor used in the semiconductor layer 4 is an amorphous oxide semiconductor. Stated specifically, it may preferably be an oxide composed chiefly of ZnO as constituent elements, an oxide composed chiefly of $In_2O_3$ as constituent elements, an oxide composed chiefly of $Ga_2O_3$ as constituent elements, or an oxide composed chiefly of a composite oxide containing two or more of any of these, as constituent elements. In particular, it may preferably be an oxide containing $In_2O_3$ and ZnO the total content of which is at least half of the whole in molar ratio. Besides, it may also include an oxide semiconductor such as $SnO_2$ or $TiO_x$. Those including other oxide semiconductors may also be used.

As the protective layer 7, a metal oxide film may be used which contains at least one metallic element. It is preferable to use as the protective layer a film containing, among metal oxides, at least one of the following: $SnO_2$, $Al_2O_3$, $Ga_2O_3$, $In_2O_3$, MgO, CaO, SrO, BaO, ZnO, $Nb_2O_5$, $Ta_2O_5$, $TiO_2$, $ZrO_2$, $HfO_2$, $CeO_2$, $Li_2O$, $Na_2O$, $K_2O$, $Rb_2O$, $Sc_2O_3$, $Y_2O_3$, $La_2O_3$, $Nd_2O_3$, $Sm_2O_3$, $Gd_2O_3$, $Dy_2O_3$, $Er_2O_3$ and $Yb_2O_3$. Besides these, a metal nitride ($MN_x$, where M is a metallic element) may also be used. Still besides these, a metal oxynitride ($MO_xN_y$, where M is a metallic element) may also be used.

As a means by which the above metal oxide, metal nitride or metal oxynitride film is formed as the protective layer on the thin-film transistor, a vapor phase process may be used, such as sputtering, pulse laser deposition or electron beam deposition. Film forming processes are by no means limited to these processes.

How to fabricate the bottom gate type thin-film transistor of this embodiment is described next.

First, as a first step, an amorphous transparent conductive film is formed by deposition on the substrate. Then, the amorphous transparent conductive film formed is patterned to form a transparent gate electrode.

Next, as a second step, a gate insulating layer is formed on the gate electrode. As a film forming process for the gate insulating layer, a vapor phase process may preferably be used, such as sputtering, pulse laser deposition or electron beam deposition. Film forming processes are by no means limited to these processes.

Next, as a third step, a semiconductor layer is formed on the gate insulating layer.

According to a finding obtained by the present inventors, the semiconductor layer shows good characteristics when its layer thickness is in the range of 30 nm±15 nm. This is demonstrated with reference to experimental data shown in FIG. 13.

Figure 13:
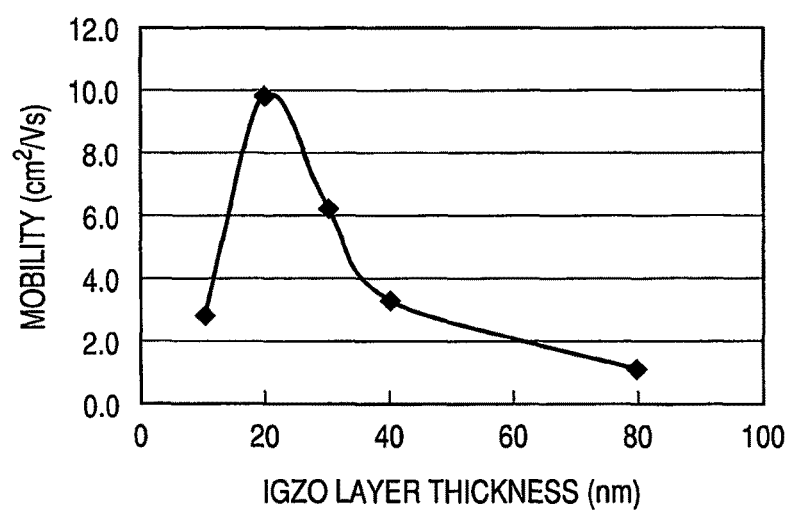
FIG. 13 is a graph showing the relationship between mobility and semiconductor layer thickness of a thin-film transistor.

FIG. 13 shows characteristics of a thin-film transistor fabricated by growing a thermal oxide film as a gate insulating layer on a silicon substrate as a gate electrode, forming thereon a semiconductor layer in different thickness by deposition, and forming layers of titanium, gold and titanium in this order to form a source electrode and a drain electrode.

In FIG. 13, the abscissa indicates the semiconductor layer thickness, and the ordinate the mobility. Semiconductor layers used are each formed by sputtering at room temperature, using a target composed of In, Ga and Zn in an atomic compositional ratio of 1:1:1.

Here, a thermal oxide film having a surface roughness of 2 to 4 nm is used as the gate insulating layer, and hence the unevenness present at the interface between the semiconductor layer and the gate insulating layer is 2 to 4 nm or less. This interface has an ideal smoothness.

As is clear from FIG. 13, the mobility shows a maximum value when the layer thickness of the semiconductor is around 20 nm. According to another finding obtained by the present inventors, good values are obtained when the semiconductor layer thickness is in the range of 30 nm±15 nm, also in respect of characteristics such as S value, threshold voltage and on-current.

Thus, the semiconductor in the third step may preferably be in a layer thickness of from 30 nm±15 nm.

Further, the unevenness (also called roughness) of the interface between the semiconductor layer and the gate insulating layer is required to be small, because the difficulties stated previously come about. According to still another finding obtained by the present inventors, in order to obtain good characteristics, the difference between hill tops and dale bottoms of unevenness in the vertical direction at the interface between the gate insulating layer and the semiconductor layer may preferably be set to be not more than the layer thickness of the semiconductor layer.

Next, as a fourth step, a source electrode and a drain electrode are formed on the semiconductor layer. As a film forming process for the semiconductor layer, a vapor phase process may be used, such as sputtering, pulse laser deposition or electron beam deposition. Film forming processes are by no means limited to these processes.

According to findings obtained by the present inventors, it is important that, the gate electrode is subjected to heat treatment so as to be crystallized, later than the step of forming the gate insulating layer on the gate electrode. By doing so, the difference between hill tops and dale bottoms of unevenness in the vertical direction of the interface between the gate electrode and the gate insulating layer can be controlled to be 30 nm or less, preferably 3.0 nm or less, and most preferably 1 nm or less. The heat treatment may be carried out at any stage as long as it is later than the second step of forming the gate insulating layer on the gate electrode.

EXAMPLES

The present invention is described below in greater detail by giving Examples. The present invention is by no means limited to the following Examples.

Example 1

This Example is an example in which the bottom gate type thin-film transistor shown in FIG. 1 is fabricated. In the thin-film transistor shown in FIG. 1, the layers are formed on the substrate 1 in order. Stated more specifically, the gate electrode 2, the gate insulating layer 3, the semiconductor layer 4, the source electrode 5/drain electrode 6 and the protective layer 7 are formed on the substrate 1 in this order.

A glass substrate (1737, available from Corning Glass Works) was used as the substrate 1. The glass substrate was 0.5 mm in thickness.

First, an amorphous conductive oxide layer was formed on the substrate 1. In this Example, an amorphous ITO thin film was formed by RF magnetron sputtering in an atmosphere of a mixed gas of argon gas and oxygen gas. The ratio of In:Sn was 91:9. In this Example, a polycrystalline sintered body of 3 inches in size was used as a target (material source), and applied RF power was 100 W. The atmosphere at the time of film formation had a total pressure of 2 Pa, where the argon gas was fed at 1 sccm. The film was formed at a rate of about 2.8 nm/minute, and in a thickness of 170 nm. The substrate temperature was 25° C.

Figure 2:
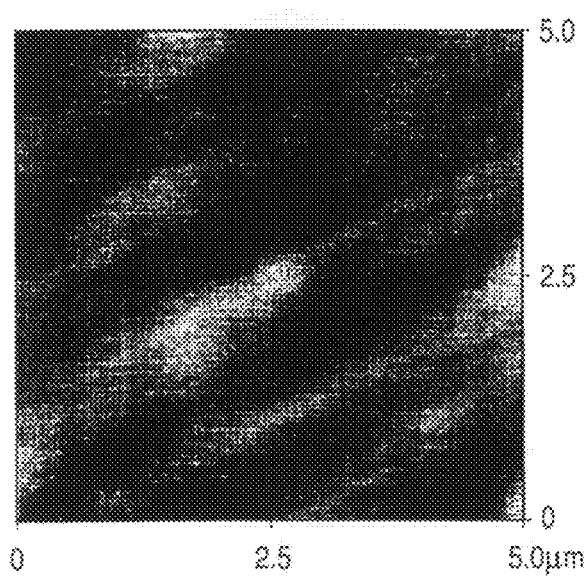
FIG. 2 is a view showing a result of observation on an atomic force microscope, of an amorphous ITO thin film formed on a glass substrate according to an embodiment of the present invention.

The surface profile of the amorphous ITO thin film obtained under the above conditions was observed on an atomic force microscope (hereinafter "AFM") to obtain the result shown in FIG. 2. Its maximum height (hereinafter "Rmax") and center-line average roughness (hereinafter "Ra") were found to be 3.8 nm and 0.4 nm, respectively.

Next, the amorphous ITO thin film thus formed by deposition was finely processed by photolithography and wet etching to form the gate electrode 2. Here, as an etchant at the time of the wet etching, a weak acid such as an aqueous solution of oxalic acid may be used.

Next, an $SiO_2$ thin film of 200 nm in thickness was formed on the gate electrode 2. The $SiO_2$ thin film serving as the gate insulating layer 3 was formed by RF magnetron sputtering, setting the substrate temperature at room temperature and the applied RF power at 400 W, in an atmosphere of 10 sccm of Ar gas and at 0.1 Pa.

Next, the $SiO_2$ thin film thus formed by deposition was finely processed by photolithography and dry etching to form the gate insulating layer 3. Here, as an etching gas at the time of the dry etching, $CF_4$ gas was used.

Figure 3:
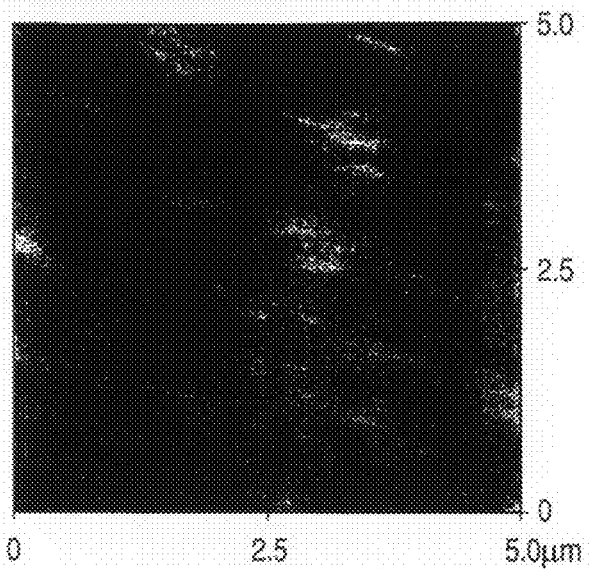
FIG. 3 is a view showing a result of observation on an atomic force microscope, of a sample obtained by forming an amorphous ITO thin film and an $SiO_2$ thin film on a glass substrate by deposition according to an embodiment of the present invention.

The surface profile of the $SiO_2$ gate insulating layer thus formed was observed on an AFM to obtain the result shown in FIG. 3. Its Rmax and Ra were found to be 3.0 nm and 0.3 nm, respectively, showing little gain in surface roughness as a result of the formation of the $SiO_2$ gate insulating layer.

Figure 4:
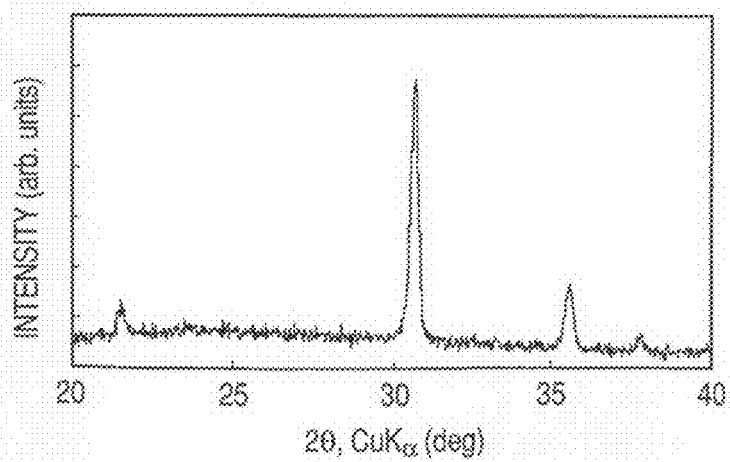
FIG. 4 is a graph showing X-ray diffraction of a sample obtained by forming an amorphous ITO thin film and an $SiO_2$ thin film on a glass substrate by deposition, followed by heat treatment at 250° C. for 30 minutes, according to an embodiment of the present invention.
Figure 5:
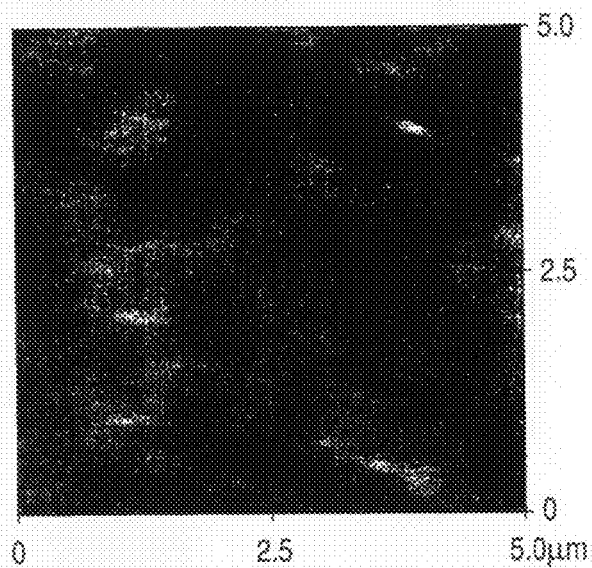
FIG. 5 is a view showing a result of observation on an atomic force microscope, of a sample obtained by forming an amorphous ITO thin film and an $SiO_2$ thin film on a glass substrate by deposition, followed by heat treatment at 250° C. for 30 minutes, according to an embodiment of the present invention.

Further, a sample obtained by forming the $SiO_2$ gate insulating layer on the amorphous ITO gate electrode was subjected to heat treatment for 20 minutes in the atmosphere and on a hot plate kept at 300° C. As the result, as shown in FIG. 4, the ITO thin film was crystallized as so ascertained by X-ray diffraction (hereinafter "XRD"). The surface roughness of the film in this state was measured with an AFM (FIG. 5) to find that Rmax and Ra were 2.4 nm and 0.2 nm, respectively, showing little gain in surface roughness of the $SiO_2$ thin film as a result of the crystallization of the ITO thin film.

The foregoing process was carried out in order to demonstrate that the sample with smooth surface was obtainable by forming the ITO thin film in an amorphous state and, after covering the ITO thin film with the $SiO_2$ thin film, carrying out the heat treatment for crystallization. In an actual process in this Example, the heat treatment may be carried out at any stage as long as it is later than the step of forming the gate insulating layer on the gate electrode. Instead, all the layers making up the thin-film transistor may be kept amorphous until the step of forming the source electrode and the drain electrode, and the heat treatment may be carried out after that step.

The semiconductor layer 4 is formed on the gate insulating layer 3. In this Example, as the semiconductor layer 4, an oxide semiconductor In—Ga—Zn—O thin film is formed by RF magnetron sputtering in a thickness of 40 nm. The In—Ga—Zn—O stands amorphous, and the In—Ga—Zn—O is in a compositional ratio of 1:1:1:4. This In—Ga—Zn—O thin film was formed by RF magnetron sputtering, setting the substrate temperature at room temperature and the applied RF power at 200 W, in an atmosphere of 25 sccm of Ar gas containing 5% of $O_2$ and at 0.5 Pa.

Next, the In—Ga—Zn—O thin film thus formed by deposition is finely processed by photolithography and wet etching to form the semiconductor layer 4.

The source electrode 5 and the drain electrode 6 are formed on the semiconductor layer 4. In this Example, an IZO thin film is formed by RF magnetron sputtering in a thickness of 100 nm. The IZO thin film for the source electrode 5 and drain electrode 6 is formed by RF magnetron sputtering, setting the substrate temperature at room temperature and the applied RF power at 100 W, in an atmosphere of 50 sccm of Ar gas and at 0.3 Pa.

Next, the IZO thin film thus formed by deposition is finely processed by photolithography and wet etching to form the source electrode 5 and the drain electrode 6.

The protective layer 7 is formed on the source electrode 5 and the drain electrode 6. The protective layer 7 is composed of $SiO_2$. An $SiO_2$ thin film as the protective layer 7 is formed by RF magnetron sputtering, setting the substrate temperature at room temperature and the applied RF power at 200 W, in an atmosphere of 5 sccm of Ar gas and 5 sccm of $O_2$ gas and at 0.1 Pa.

Next, the $SiO_2$ thin film thus formed by deposition is finely processed by photolithography and dry etching to form the protective layer 7. As an etching gas for the dry etching, $CF_4$ gas is used.

In the above steps, all the layers making up the thin-film transistor are formed at room temperature, which, however, may be formed in the state the substrate temperature is kept at a high temperature. Taking account of the fact that the layers of the thin-film transistor are formed on a glass substrate or a plastic film, all the layers may preferably be formed at a temperature of 250° C. or less.

Next, the thin-film transistor thus obtained is subjected to heat treatment at 250° C. for 30 minutes in the atmosphere to crystallize the gate electrode composed of amorphous ITO.

The thin-film transistor fabricated through the foregoing steps had a difference between hill tops and dale bottoms of unevenness in the vertical direction, of 3.8 nm at the interface between the gate electrode and the gate insulating layer. Hence, it can be kept from any increase in leak current that is due to local electric-filed concentration.

In addition, the thin-film transistor fabricated through the foregoing steps had a difference between hill tops and dale bottoms of unevenness in the vertical direction, of 2.4 nm at the interface between the gate insulating layer and the semiconductor layer. Hence, any shift of the threshold value in drain current/gate voltage characteristics can be made to be less caused by the capture of electric charges that is due to interface levels present at that interface.

It has been seen from the above result that forming the gate electrode in an amorphous state and, after covering the gate electrode with the gate insulating layer, carrying out the heat treatment for crystallization enables the following. That is, compared with a case making use of the gate electrode which is polycrystalline at the time of its film formation, the unevenness of the surface in each constituent layer which makes up the thin-film transistor can greatly be kept from coming about.

Example 2

This Example is an example in which the bottom gate type thin-film transistor shown in FIG. 1 is fabricated. In the thin-film transistor shown in FIG. 1, the layers are formed on the substrate 1 in order. Stated more specifically, the gate electrode 2, the gate insulating layer 3, the semiconductor layer 4, the source electrode 5/drain electrode 6 and the protective layer 7 are formed on the substrate 1 in this order.

A glass substrate (1737, available from Corning Glass Works) was used as the substrate 1. The glass substrate is 0.5 mm in thickness.

First, a polycrystalline ITO thin film was formed on the substrate 1. In this Example, the polycrystalline ITO thin film was formed by RF magnetron sputtering in an atmosphere of a mixed gas of argon gas and oxygen gas.

Figure 6:
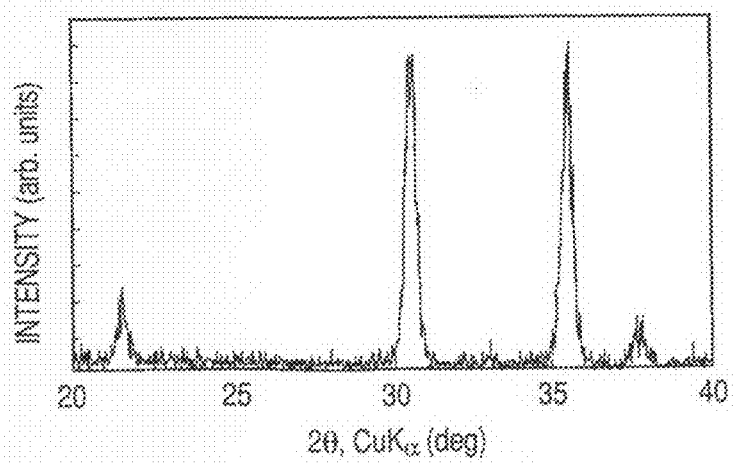
FIG. 6 is a graph showing X-ray diffraction of a polycrystalline ITO thin film formed on a glass substrate according to Example 2.

The ITO thin film thus formed was observed by XRD to obtain the result shown in FIG. 6. Clear diffraction peaks showing a crystalline state were seen, to find that the ITO thin film obtained was in a polycrystalline form.

Figure 7:
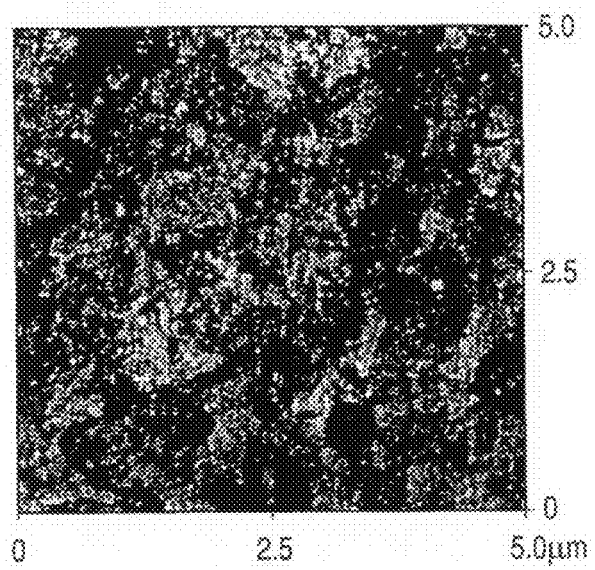
FIG. 7 is a view showing a result of observation on an atomic force microscope, of the polycrystalline ITO thin film formed on a glass substrate according to Example 2.

Since the polycrystalline ITO thin film obtained was in a polycrystalline form, it has a large unevenness on its surface if it is left as it is, but can have a small unevenness by subjecting it to post treatment. For example, the ITO thin film may be irradiated on its surface with argon iron beams or the like by cluster ion beam irradiation. The surface profile of the above ITO thin film was observed on an AFM to obtain the result shown in FIG. 7. Its Rmax and Ra were found to be 27.7 nm and 2.1 nm, respectively.

Next, the ITO thin film thus formed by deposition was finely processed by photolithography and wet etching to form the gate electrode 2.

Next, an $SiO_2$ thin film of 200 nm in thickness was formed on the gate electrode 2. The $SiO_2$ thin film serving as the gate insulating layer 3 was formed by RF magnetron sputtering, setting the substrate temperature at room temperature and the applied RF power at 400 W, in an atmosphere of 10 sccm of Ar gas and at 0.1 Pa.

Next, the $SiO_2$ thin film thus formed by deposition was finely processed by photolithography and dry etching to form the gate insulating layer 3. Here, as an etching gas at the time of the dry etching, $CF_4$ gas was used.

Figure 8:
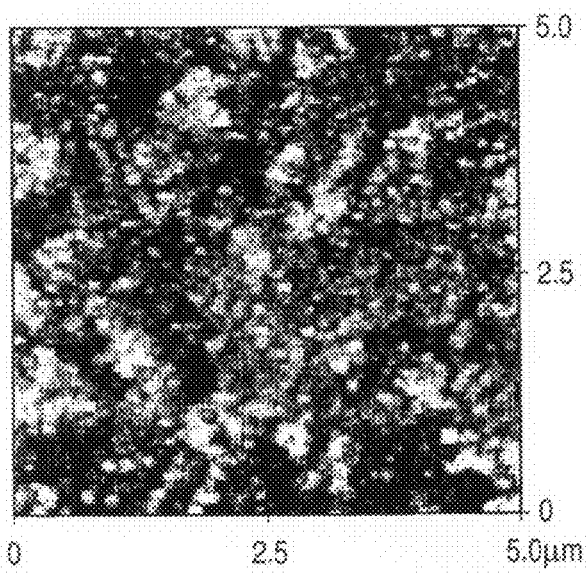
FIG. 8 is a view showing a result of observation on an atomic force microscope, of a sample obtained by forming a polycrystalline ITO thin film and an $SiO_2$ thin film on a glass substrate by deposition according to Example 2.

The surface profile of the $SiO_2$ gate insulating layer thus formed was observed on an AFM to obtain the result shown in FIG. 8. Its Rmax and Ra were found to be 26.4 nm and 0.9 nm, respectively, reflecting the surface profile of the gate electrode 2.

The semiconductor layer 4 was formed on the gate insulating layer 3. In this Example, as the semiconductor layer 4, an oxide semiconductor In—Ga—Zn—O thin film was formed by RF magnetron sputtering in a thickness of 40 nm. The In—Ga—Zn—O stands amorphous, and the In—Ga—Zn—O is in a compositional ratio of 1:1:1:4. This In—Ga—Zn—O thin film is formed by RF magnetron sputtering, setting the substrate temperature at room temperature and the applied RF power at 200 W, in an atmosphere of 25 sccm of Ar gas containing 5% of $O_2$ and at 0.5 Pa.

Next, the In—Ga—Zn—O thin film thus formed by deposition is finely processed by photolithography and wet etching to form the semiconductor layer 4.

The source electrode 5 and the drain electrode 6 are formed on the semiconductor layer 4. In this Example, an IZO thin film is formed by RF magnetron sputtering in a thickness of 100 nm. The IZO thin film for the source electrode 5 and drain electrode 6 is formed by RF magnetron sputtering, setting the substrate temperature at room temperature and the applied RF power at 100 W, in an atmosphere of 50 sccm of Ar gas and at 0.3 Pa.

Next, the IZO thin film thus formed by deposition is finely processed by photolithography and wet etching to form the source electrode 5 and the drain electrode 6.

The protective layer 7 is formed on the source electrode 5 and the drain electrode 6. The protective layer 7 is composed of $SiO_2$. An $SiO_2$ thin film as the protective layer 7 is formed by RF magnetron sputtering, setting the substrate temperature at room temperature and the applied RF power at 200 W, in an atmosphere of 5 sccm of Ar gas and 5 sccm of $O_2$ gas and at 0.1 Pa.

Next, the $SiO_2$ thin film thus formed by deposition is finely processed by photolithography and dry etching to form the protective layer 7. As an etching gas for the dry etching, $CF_4$ gas is used.

The thin-film transistor fabricated through the foregoing steps had a difference between hill tops and dale bottoms of unevenness in the vertical direction, of 27.7 nm at the interface between the gate electrode and the gate insulating layer. Hence, it can be kept from any increase in leak current that is due to local electric-filed concentration.

In addition, the thin-film transistor fabricated through the foregoing steps had a difference between hill tops and dale bottoms of unevenness in the vertical direction, of 26.4 nm at the interface between the gate insulating layer and the semiconductor. Hence, any shift of the threshold value in drain current/gate voltage characteristics can be made to be less caused by the capture of electric charges that is due to interface levels present at that interface.

In the following, for comparison, an example in which an ITO thin film having a large surface roughness is used in the gate electrode is described with reference to the drawings.

Comparative Example 1

Figure 9:
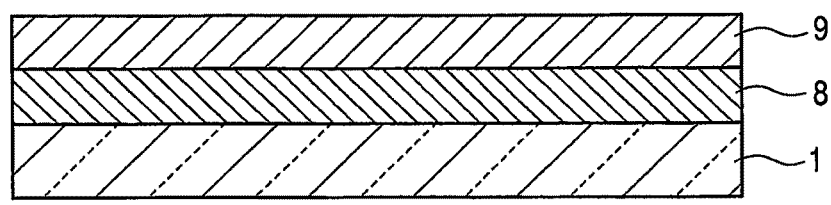
FIG. 9 is a sectional view of films layered on a substrate according to Comparative Example 1.

This Comparative Example is an example in which deposited films, a polycrystalline ITO thin film 8 and an $SiO_2$ thin film 9, are formed on a glass substrate 1 as shown in FIG. 9. The deposited films shown in FIG. 9 are formed on the substrate 1. Stated more specifically, the polycrystalline ITO thin film 8 and the $SiO_2$ thin film 9 are formed on the substrate 1.

A glass substrate (1737, available from Corning Glass Works) was used as the substrate 1. The glass substrate is 0.5 mm in thickness.

First, the polycrystalline ITO thin film 8 was formed on the substrate 1. In this Comparative Example, the polycrystalline ITO thin film 8 was formed by RF magnetron sputtering in an atmosphere of a mixed gas of argon gas and oxygen gas.

Figure 10:
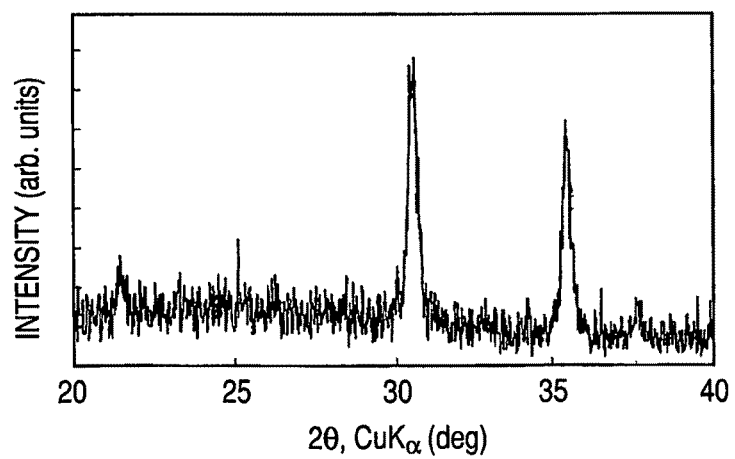
FIG. 10 is a graph showing X-ray diffraction of a polycrystalline ITO thin film formed on a glass substrate according to Comparative Example 1.

The ITO thin film thus formed was observed by XRD to obtain the result shown in FIG. 10. Clear diffraction peaks showing a crystalline state were seen, to find that the ITO thin film obtained was in a polycrystalline form.

Figure 11:
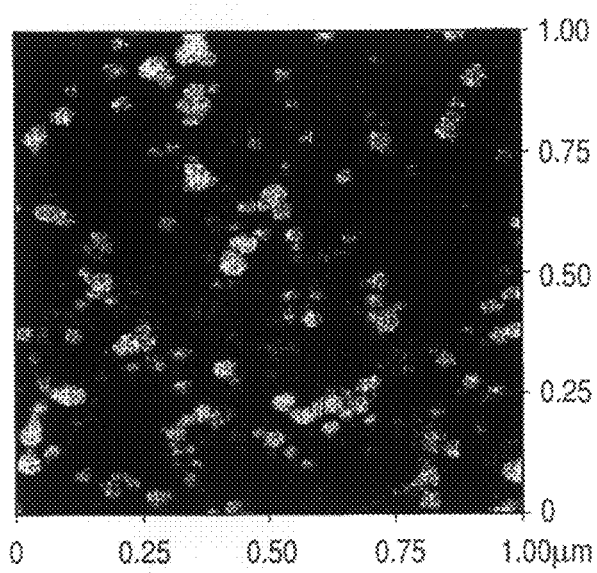
FIG. 11 is a view showing a result of observation on an atomic force microscope, of the polycrystalline ITO thin film formed on a glass substrate according to Comparative Example 1.

The surface profile of this ITO thin film was also observed on an AFM to obtain the result shown in FIG. 11. Its Rmax and Ra were found to be 68.1 nm and 8.1 nm, respectively.

Next, on the polycrystalline ITO thin film 8, the $SiO_2$ thin film 9 was formed in a thickness of 200 nm. The $SiO_2$ thin film 9 was formed by RF magnetron sputtering, setting the substrate temperature at room temperature and the applied RF power at 400 W, in an atmosphere of 10 sccm of Ar gas and at 0.1 Pa.

Figure 12:
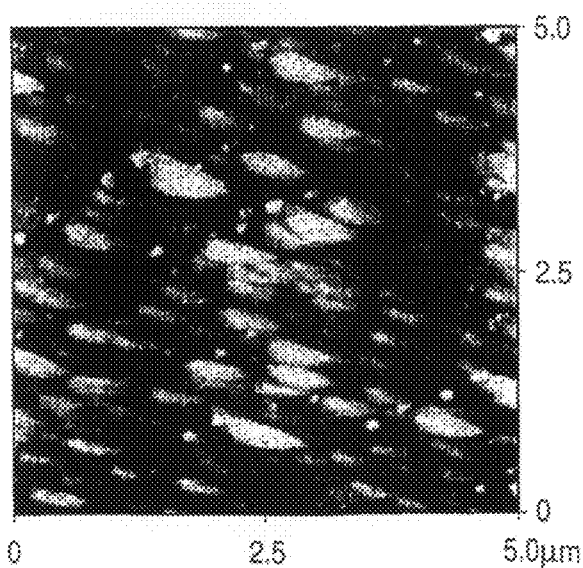
FIG. 12 is a view showing a result of observation on an atomic force microscope, of a sample obtained by forming a polycrystalline ITO thin film and an $SiO_2$ thin film on a glass substrate by deposition according to Comparative Example 1.

The surface profile of the $SiO_2$ thin film 9 thus formed was observed on an AFM to obtain the result shown in FIG. 12. Its Rmax and Ra were found to be 94.0 nm and 5.3 nm, respectively. It was ascertainable that the surface of the resultant $SiO_2$ thin film 9 as well stood greatly rough, reflecting the surface roughness of the polycrystalline ITO thin film 8.

The surface roughness of the $SiO_2$ thin film formed in Example 1 given previously had Rmax of 3.0 nm and Ra of 0.3 nm. Thus, the amorphous $SiO_2$ thin film formed on the polycrystalline ITO thin film was seen to have surface area which is larger than the amorphous $SiO_2$ thin film formed on the amorphous ITO thin film.

The largeness in surface area of the amorphous $SiO_2$ thin film leads to the largeness in surface area of the interface between the $SiO_2$ gate insulating layer and the semiconductor layer, and hence it means that a large absolute value of interface defect level may result as long as the interface has the same interface defect density.

Accordingly, in the above bottom gate type thin-film transistor in which the ITO thin film formed under such conditions that it comes to have the polycrystalline form at the time its formation has been completed is used as the gate electrode, the following can be said. That is, since it has a large unevenness at the interface between the gate insulating layer and the semiconductor layer, the interface has a relatively large area compared with the thin-film transistor having no large unevenness at that interface. Thus, it is considered that the shift of the threshold value in drain current/gate voltage characteristics may greatly be caused by the capture of electric charges that is due to interface levels present at that interface.

It is also considered that, since the above thin-film transistor fabricated through the above process has a large unevenness at the interface between the gate electrode and the gate insulating layer, it causes, e.g., an increase in leak current that is due to local electric-filed concentration.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-118736, filed Apr. 27, 2007, Japanese Patent Application No. 2008-009110, filed Jan. 18, 2008, and Japanese Patent Application No. 2008-083386, filed Mar. 27, 2008, which are hereby incorporated by reference herein in their entirety.

The invention claimed is:
1. A bottom gate type thin-film transistor comprising at least:

a substrate, a gate electrode, a gate insulating layer, and a semiconductor layer in that order;

a pair of a source electrode and a drain electrode, and said transistor having a lower interface between said gate electrode and said gate insulating layer and an upper interface between said gate insulating layer and said semiconductor layer, wherein said semiconductor layer is an In—Ga—Zn—O thin film which is an amorphous oxide semiconductor film and shows an electron mobility of not less than 2 cm$^2$/Vs, wherein said lower interface has a difference between hill tops and dale bottoms of unevenness in a direction along a thickness of the gate insulating layer, of 30 nm or less, and wherein a difference between hill tops and dale bottoms of unevenness in said direction at said upper interface is not more than a layer thickness of said semiconductor layer, and wherein said layer thickness of said semiconductor layer is within a range of 15 nm or more to less than 45 nm.

2. A bottom gate type thin-film transistor comprising at least:

a substrate, a gate electrode, a gate insulating layer and a semiconductor layer in that order; and a pair of a source electrode and a drain electrode, wherein said semiconductor layer is an In—Ga—Zn—O thin film which is an amorphous oxide semiconductor film and shows an electron mobility of not less than 2 cm$^2$/Vs, wherein a lower interface between said gate electrode and said gate insulating layer has a difference between hill tops and dale bottoms of unevenness in a direction along a thickness of said gate insulating layer, of 30 nm or less, and wherein a difference between hill tops and dale bottoms of unevenness in said direction at an upper interface between said gate insulating layer and said semiconductor layer is not more than a layer thickness of said semiconductor layer, and wherein said layer thickness of said semiconductor layer is within a range of 15 nm or more to less than 45 nm.

3. A bottom gate type thin-film transistor comprising at least:

a substrate, a gate electrode, a gate insulating layer and a semiconductor layer in that order; and a pair of a source electrode and a drain electrode, wherein said semiconductor layer is an In—Ga—Zn—O thin film which is an amorphous oxide semiconductor film, wherein a lower interface between said gate electrode and said gate insulating layer has a difference between hill tops and dale bottoms of unevenness in a direction along a thickness of said gate insulating layer, of 30 nm or less, wherein a difference between hill tops and dale bottoms of unevenness in said direction at an upper interface between said gate insulating layer and said semiconductor layer is not more than a layer thickness of the semiconductor layer, and wherein said layer thickness of said semiconductor layer is within a range of 15 nm or more to less than 45 nm, such that said semiconductor layer shows an electron mobility of not less than 2 cm$^2$/Vs.

4. A bottom gate type thin-film transistor comprising at least:

a substrate, a gate electrode, a gate insulating layer and a semiconductor layer in that order; and a pair of a source electrode and a drain electrode, wherein said semiconductor layer is an In-Ga-Zn-O thin film which is an amorphous oxide semiconductor film and shows an electron mobility of not less than 2 cm$^2$/Vs, wherein a surface of said gate electrode in an interface between said gate electrode and said gate insulating layer has a difference between hill tops and dale bottoms of unevenness in a direction along a thickness of the gate insulating layer, of 30 nm or less, wherein a surface of said gate insulating layer in an interface between said gate insulating layer and said semiconductor layer has a difference between hill tops and dale bottoms of uneveness in the direction, which is not more than a layer thickned of said semiconductor layer and wherein said layer thickness of said semiconductor layer is within a range of 15 nm or more to less than 45nm.

\* \* \* \* \*